United States Patent
Ohata

(10) Patent No.: US 9,532,447 B2
(45) Date of Patent: Dec. 27, 2016

(54) MULTI-LAYER RESIN SUBSTRATE AND METHOD OF MANUFACTURING MULTI-LAYER RESIN SUBSTRATE

(71) Applicant: Murata Manufacturing Co., Ltd., Kyoto (JP)

(72) Inventor: Hiroyuki Ohata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/754,796

(22) Filed: Jun. 30, 2015

(65) Prior Publication Data

US 2015/0305150 A1    Oct. 22, 2015

Related U.S. Application Data

(63) Continuation of application No. PCT/JP2013/081845, filed on Nov. 27, 2013.

(30) Foreign Application Priority Data

Jan. 9, 2013   (JP) ................................ 2013-001942

(51) Int. Cl.
   *C08J 3/28*   (2006.01)
   *H05K 1/03*   (2006.01)
   (Continued)

(52) U.S. Cl.
   CPC ............ *H05K 1/0353* (2013.01); *B32B 37/04* (2013.01); *B32B 37/06* (2013.01); *B32B 37/10* (2013.01);
   (Continued)

(58) Field of Classification Search
   CPC ............. C08J 3/28; C08J 3/23; C08J 2367/00; C09K 19/38
   See application file for complete search history.

(56) References Cited

U.S. PATENT DOCUMENTS

| | | | |
|---|---|---|---|
| 5,954,906 A * | 9/1999 | Abe ..................... | B41M 7/0027 156/247 |
| 2002/0119396 A1* | 8/2002 | Jiang ..................... | H01L 21/486 430/311 |

(Continued)

FOREIGN PATENT DOCUMENTS

| | | |
|---|---|---|
| JP | H09-055582 A | 2/1997 |
| JP | 2003-249742 A | 9/2003 |

(Continued)

OTHER PUBLICATIONS

English translation of Written Opinion of the International Search Authority for Application No. PCT/JP2013/081845 dated Jan. 7, 2014.

(Continued)

*Primary Examiner* — Betelhem Shewareged
(74) *Attorney, Agent, or Firm* — Pearne & Gordon LLP

(57) ABSTRACT

A multi-layer resin substrate is a multi-layer resin substrate integrated by stacking and thermocompression bonding a plurality of resin layers each composed of a thermoplastic resin as a main material and having a main surface. The plurality of resin layers include a resin layer having a pattern member arranged on the main surface. A surface of at least some resin layers of the plurality of resin layers has a paint layer, which is obtained by applying a thermoplastic resin paint to a region corresponding to a region insufficient in thickness as a stack as a whole during a process for stacking and thermocompression bonding the plurality of resin layers. The pattern member is provided, for example, by a conductor pattern.

19 Claims, 6 Drawing Sheets

(51) Int. Cl.
*C09K 19/38* (2006.01)
*H05K 3/46* (2006.01)
*B32B 37/06* (2006.01)
*B32B 37/10* (2006.01)
*B32B 37/04* (2006.01)
*B32B 38/00* (2006.01)

(52) U.S. Cl.
CPC ............ *B32B 38/145* (2013.01); *C08J 3/28* (2013.01); *C09K 19/38* (2013.01); *H05K 3/4632* (2013.01); *B32B 2305/55* (2013.01); *B32B 2457/202* (2013.01); *C08J 2300/00* (2013.01); *C08J 2367/00* (2013.01); *H05K 2201/0129* (2013.01); *H05K 2201/09881* (2013.01); *H05K 2201/09909* (2013.01)

(56) References Cited

U.S. PATENT DOCUMENTS

| | | | |
|---|---|---|---|
| 2002/0134584 A1* | 9/2002 | Higuchi | H05K 3/4069 174/264 |
| 2002/0155661 A1* | 10/2002 | Massingill | H01L 21/486 438/244 |
| 2003/0196747 A1* | 10/2003 | Kwasny | B32B 38/10 156/230 |
| 2004/0040651 A1 | 3/2004 | Tsugaru et al. | |
| 2009/0107624 A1 | 4/2009 | Tsugaru | |
| 2014/0030471 A1 | 1/2014 | Otsubo | |
| 2015/0299405 A1* | 10/2015 | Ohata | C08J 3/28 252/299.01 |
| 2015/0305150 A1* | 10/2015 | Ohata | H05K 3/4632 428/201 |

FOREIGN PATENT DOCUMENTS

| | | |
|---|---|---|
| JP | 2003-273511 A | 9/2003 |
| JP | 2004-111942 A | 4/2004 |
| JP | 2006-305921 A | 9/2006 |
| JP | 2008-172030 A | 7/2008 |
| JP | 2010-147419 A | 7/2010 |
| WO | 2012-137626 A1 | 10/2012 |

OTHER PUBLICATIONS

English translation of International Search Report for Application No. PCT/JP2013/081845 dated Dec. 18, 2013.

\* cited by examiner

MULTI-LAYER RESIN SUBSTRATE AND METHOD OF MANUFACTURING MULTI-LAYER RESIN SUBSTRATE

BACKGROUND

Technical Field

The present disclosure relates to a multi-layer resin substrate and a method of manufacturing the same.

Background Art

Japanese Patent Laying-Open No. 2003-273511 (PTD 1) describes arrangement of a member for pressing, which has a buffering effect between a hot pressing plate and a resin film for the purpose of prevention of position displacement of a conductor pattern during pressing due to projections and recesses attributed to the conductor pattern formed on the resin film.

Japanese Patent Laying-Open No. 2006-305921 (PTD 2) describes layering a liquid crystal polymer film as a cover layer so as to cover an upper surface of a circuit pattern sheet, layering a fluorine-based porous film as a mold release material, and then pressing the layered structure from above.

Japanese Patent Laying-Open No. 2010-147419 (PTD 3) describes a method of manufacturing a multi-layer circuit substrate by stacking resin films composed of a thermoplastic resin having a conductor pattern formed on one surface, heating and pressurizing the stack with a hot pressing plate, and bonding the stack together, in which in order to avoid position displacement of a conductor pattern, defective interlayer connection between connection conductors, and insufficient adhesion between resin films in spite of increase in number of stacked resin films, a glass fiber nonwoven fabric is interposed between the hot pressing plate and the stack, a resin sheet is further interposed between the glass fiber nonwoven fabric and the stack, and heating and pressurization with the hot pressing plate is carried out in this state.

Japanese Patent Laying-Open No. 2008-172030 (PTD 4) describes interposing a press pressure correction sheet between a hot pressing plate and a stack in order to suppress deformation of a conductor pattern or position displacement of conductor patterns from each other which is caused depending on whether or not a conductor pattern is present, in manufacturing of a multi-layer circuit substrate by stacking resin films composed of a thermoplastic resin having a conductor pattern formed. The press pressure correction sheet here is such a sheet that a projection is formed from a metal pattern on a surface of a resin sheet.

PTD 1: Japanese Patent Laying-Open No. 2003-273511
PTD 2: Japanese Patent Laying-Open No. 2006-305921
PTD 3: Japanese Patent Laying-Open No. 2010-147419
PTD 4: Japanese Patent Laying-Open No. 2008-172030

SUMMARY

Technical Problem

PTDs 1 to 4 are all common in fundamental concept to obtain a stack by stacking all pattern sheets while a difference in thickness caused by a local pattern of each of the pattern sheets forming the stack is allowed to remain and to carry out pressing with a buffer member being layered on an outermost surface of the stack. Though adhesion between layers is satisfactory and displacement of a pattern may be prevented by adopting the inventions described in PTDs 1 to 4, projections and recesses resulting from a difference in thickness caused by a pattern in the inside of the stack become noticeable at the outermost surface of the stack obtained after pressing, which will be described below.

For example, a situation as shown in FIG. 13 is assumed. Resin layers 2 are provided as a plurality of pattern sheets, a conductor pattern 7 is arranged on one surface of each resin layer 2, and a via conductor 6 penetrating each resin layer 2 in a direction of thickness is also arranged. A stack is obtained by stacking such a plurality of pattern sheets, and the stack is subjected to thermocompression bonding with cushion materials 4 being interposed between the stack and upper and lower pressing plates 31 and 32, respectively. In this case, since action of force is made uniform as a result of the function of cushion materials 4, thermocompression bonding per se may normally be carried out. A multi-layer resin substrate obtained by thermocompression bonding the stack, however, is as shown in FIG. 14. In a multi-layer resin substrate 901 shown in FIG. 14, in a region where a large number of conductor patterns 7 are present as being layered, an outermost surface protrudes by an amount comparable to thicknesses of conductor patterns 7. In multi-layer resin substrate 901, projections and recesses thus are noticeable at the outermost surface lower flatness of the outermost surface and create a large height difference D between electrodes arranged on the outermost surface. When such a large height difference D is caused between electrodes, it may be difficult to surface mount an IC or other components on such a surface or connection may be defective in connection of multi-layer resin substrate 901 to other motherboards.

Then, the present disclosure provides a multi-layer resin substrate in which flatness of an outermost surface of a stack obtained by stacking individual resin layers can sufficiently be ensured even though the resin layers are different in thickness from each other depending on whether or not there is a local pattern, and a method of manufacturing the same.

Solution to Problem

In order to achieve the object above, a multi-layer resin substrate based on the present disclosure is a multi-layer resin substrate integrated by stacking and thermocompression bonding a plurality of resin layers each composed of a thermoplastic resin as a main material and having a main surface, the plurality of resin layers including a resin layer having a pattern member arranged on the main surface, and a surface of at least one resin layer of the plurality of resin layers having a paint layer, which is obtained by applying a thermoplastic resin paint to a region corresponding to a region insufficient in thickness as a stack as a whole during a process for stacking and thermocompression bonding the plurality of resin layers.

Advantageous Effects

According to the present disclosure, since a paint layer obtained by applying a thermoplastic resin paint is provided in a region corresponding to a region insufficient in thickness as a stack as a whole, a thickness of the stack as a whole is compensated for by a thickness of the paint layer in such a region. Even though individual resin layers are different in thickness from each other depending on whether or not there is a local pattern, flatness of an outermost surface of the obtained stack can sufficiently be ensured.

DESCRIPTION OF EMBODIMENTS

First Embodiment

Figure 1:
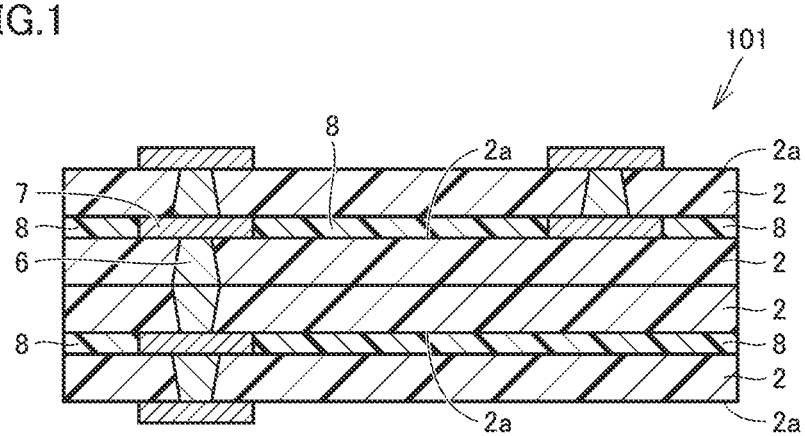
FIG. 1 is a cross-sectional view of a multi-layer resin substrate in a first embodiment based on the present disclosure.
Figure 2:
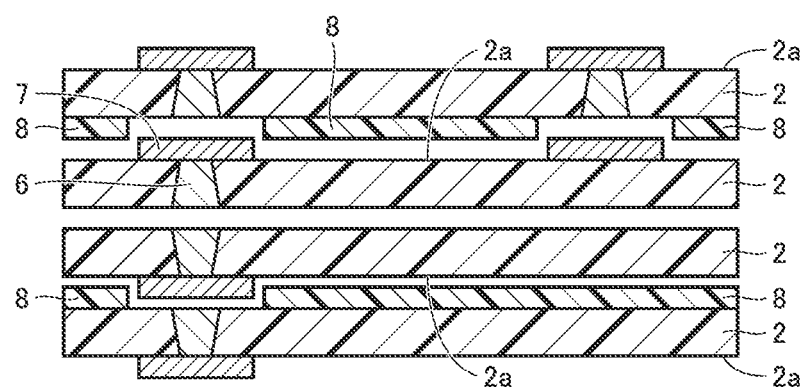
FIG. 2 is an exploded view of a state of the multi-layer resin substrate before thermocompression bonding in the first embodiment based on the present disclosure.
Figure 14:
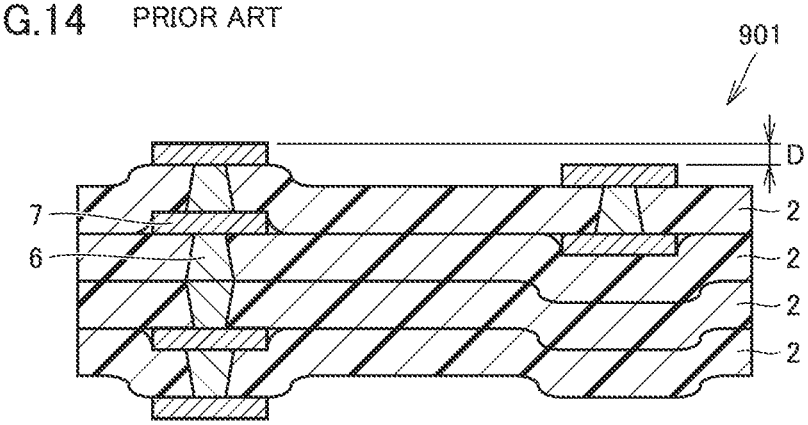
FIG. 14 is a cross-sectional view of one example of a multi-layer resin substrate obtained with the method of manufacturing a multi-layer resin substrate based on the conventional technique.

A multi-layer resin substrate in a first embodiment based on the present disclosure will be described with reference to FIGS. 1 and 2. FIG. 1 shows a cross-sectional view of this multi-layer resin substrate and FIG. 2 shows an exploded view of a state before thermocompression bonding. As shown in FIG. 1, a multi-layer resin substrate 101 in the present embodiment is a multi-layer resin substrate integrated by stacking and thermocompression bonding a plurality of resin layers 2 each composed of a thermoplastic resin as a main material and having a main surface 2a. The plurality of resin layers 2 include resin layer 2 having a pattern member arranged on main surface 2a. In the example shown in the present embodiment, all of four resin layers 2 fall under resin layer 2 having a pattern member arranged on main surface 2a. In the example shown in the present embodiment, the pattern member is provided by a conductor pattern 7. In the present disclosure, however, the pattern member is not limited to conductor pattern 7. For example, a via conductor 6 may fall under the pattern member when it affects a thickness of a stack as a whole. At a surface of at least some resin layers 2 of the plurality of resin layers 2, a thermoplastic resin paint is applied to a region corresponding to a region insufficient in thickness as the stack as a whole during a process for stacking and thermocompression bonding the plurality of resin layers 2. As a result of application of the thermoplastic resin paint, a paint layer 8 is formed in such a region. Paint layer 8 shown in FIG. 1 is formed partially on the surface of any resin layer 2 as shown in FIG. 2. A region where thermoplastic resin paint layer 8 is arranged in FIGS. 1 and 2 is the region corresponding to the "region insufficient in thickness as a stack as a whole during a process for stacking and thermocompression bonding the plurality of resin layers 2." Insufficiency in thickness as a stack as a whole in such a region without arrangement of paint layer 8 can be seen also in FIG. 14. By applying the present disclosure, consequently, insufficiency in thickness as a stack as a whole does not take place even in such a region. The "region insufficient in thickness as a stack as a whole during a process for stacking and thermocompression bonding the plurality of resin layers 2" means a region which will be insufficient in thickness if no paint layer 8 is arranged, which is, for example, a region where density of arranged pattern members is low or a region where no component is contained. Though paint layer 8 is formed on a surface opposed to conductor pattern 7 as the pattern member at the time of stacking in the present embodiment, paint layer 8 may be formed on the same surface where conductor pattern 7 serving as the pattern member is formed.

In the present embodiment, at the surface of at least some resin layers 2 of the plurality of resin layers 2, paint layer 8 is formed by applying a thermoplastic resin paint to the region corresponding to the region insufficient in thickness as the stack as a whole. Therefore, a thickness as the stack as a whole is compensated for by a thickness of paint layer 8 in such a region. Therefore, flatness of an outermost surface of a stack obtained by stacking individual resin layers 2 can sufficiently be ensured as shown in FIG. 1 even though resin layers 2 are different in thickness from each other depending on whether or not there is a local pattern.

A "region insufficient in thickness as a stack as a whole" may give rise to a problem in terms of whether or not a thickness as the stack as a whole is insufficient as compared with other regions, and resin layer 2 which is a factor for insufficiency in thickness is not necessarily the same as resin layer 2 having paint layer 8 formed.

In the multi-layer resin substrate based on the present disclosure, the "region insufficient in thickness as a stack as a whole" may be a region where the pattern members or components to be contained in the stack of resin layers 2 are sparsely arranged.

In the present embodiment, a thermoplastic resin as a main material for each resin layer 2 may be a liquid crystal polymer and the thermoplastic resin paint as a material for paint layer 8 may also be a paint of the liquid crystal polymer. By adopting this feature, both of resin layer 2 and paint layer 8 as being stacked are layers of the liquid crystal polymer, and characteristics of the materials are equal therebetween.

The thermoplastic resin paint as a material for paint layer 8 may contain a powdery liquid crystal polymer. By adopting this feature, a paint layer of the liquid crystal polymer can readily be formed to a desired thickness in a desired region. The liquid crystal polymer represents one type of a resin, and it is also called as "LCP".

The thermoplastic resin paint as a material for paint layer 8 may be obtained by dispersing the powdery liquid crystal polymer in a liquid. By adopting this feature, a dispersion liquid of the liquid crystal polymer should only be applied in an application operation for forming a paint layer and operability is improved. For example, ethanol, terpineol, butyrolactone, or isopropyl alcohol can be employed as a liquid for dispersing the powdery liquid crystal polymer, that is, as a dispersant.

The powdery liquid crystal polymer here may have been subjected to surface treatment with plasma or ultra violet rays. Bonding strength of the powdery liquid crystal polymer is improved by being subjected to surface treatment with plasma or ultra violet rays. By employing the liquid crystal polymer subjected to such surface treatment as a material for paint layer 8, bonding strength between particles of the liquid crystal polymer is improved and strength of paint layer 8 itself increases. In addition, since bonding strength between the particles of the liquid crystal polymer and the surface of resin layer 2 is also improved, strength of bonding between paint layer 8 and resin layer 2 also increases. Consequently, a multi-layer resin substrate increased in strength as a whole can be obtained. Since surface treatment with ultra violet rays on the powdery liquid crystal polymer may be higher in effect of improvement in bonding strength than surface treatment with plasma, surface treatment with ultra violet rays is more preferred.

The thermoplastic resin paint as a material for paint layer 8 may contain a liquid crystal polymer in a form of varnish. The liquid crystal polymer in a form of varnish can be obtained by dissolving a solvent-soluble liquid crystal polymer in a solvent. In the liquid crystal polymer in a form of varnish, individual particles are completely dissolved in a solvent, unlike the powdery liquid crystal polymer being dispersed in a liquid. By adopting this feature, a liquid crystal polymer in a form of varnish should only be applied in an application operation for forming a paint layer and operability is improved. In a case that a liquid crystal polymer in a form of varnish is thus employed, a solvent not dissolving resin layer 2 may be selected as a solvent. For example, when n-methyl pyrrolidone is employed as a solvent, a solvent-insoluble liquid crystal polymer is employed for resin layer 2, while a liquid crystal polymer having amide bond in a part of a molecular structure and being soluble in this solvent may be employed for paint layer 8.

Second Embodiment

Figure 3:
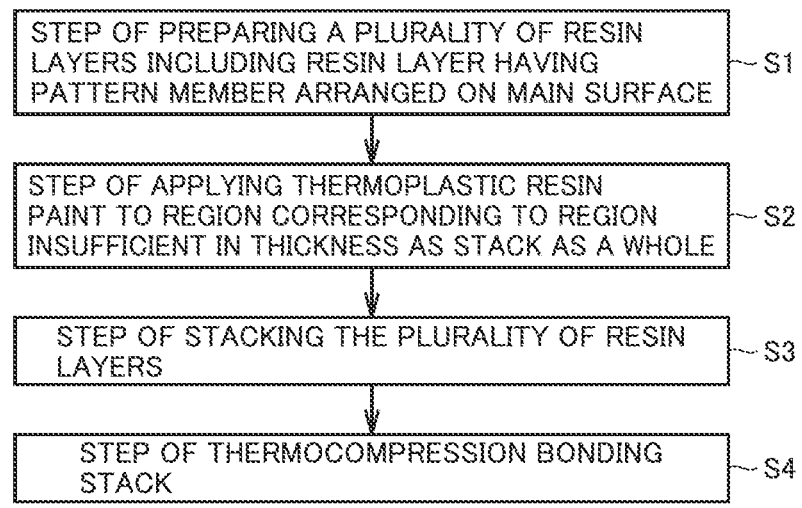
FIG. 3 is a flowchart of a method of manufacturing a multi-layer resin substrate in a second embodiment based on the present disclosure.

A method of manufacturing a multi-layer resin substrate in a second embodiment based on the present disclosure will be described with reference to FIGS. 3 to 12. FIG. 3 shows a flowchart of the method of manufacturing a multi-layer resin substrate in the present embodiment.

The method of manufacturing a multi-layer resin substrate in the present embodiment includes a step S1 of preparing a plurality of resin layers including a resin layer having a pattern member arranged on a main surface each composed of a thermoplastic resin as a main material and having the main surface, a step S2 of applying, at a surface of at least one resin layer of the plurality of resin layers, a thermoplastic resin paint to a region corresponding to a region insufficient in thickness as a stack as a whole during a process for stacking and thermocompression bonding the plurality of resin layers, a step S3 of stacking the plurality of resin layers for which the step of applying a thermoplastic resin paint has been completed, and a step S4 of thermocompression bonding the stack of the plurality of resin layers obtained in the step S3 of stacking, by applying a pressure and heat to the stack.

The method of manufacturing a multi-layer resin substrate in the present embodiment will be described in further detail.

Figure 4:
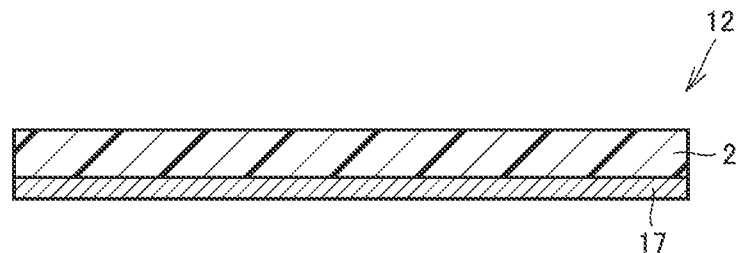
FIG. 4 is an illustrative diagram of a first step in the method of manufacturing a multi-layer resin substrate in the second embodiment based on the present disclosure.

Initially, a resin sheet 12 with a conductor foil as shown in FIG. 4 is prepared. Resin sheet 12 with a conductor foil is a sheet having such a structure that a conductor foil 17 adheres to one surface of resin layer 2. Resin layer 2 is composed of a thermoplastic resin. The thermoplastic resin is exemplified, for example, by a liquid crystal polymer (LCP). A material for resin layer 2 may be polyether ether ketone (PEEK), polyether imide (PEI), polyphenylene sulfide (PPS), or thermoplastic polyimide (PI), in addition to the LCP. Conductor foil 17 is a foil composed, for example, of Cu and having a thickness of 18 µm. Conductor foil 17 has a surface formed, for example, to have surface roughness Rz of 3 µm. A material for conductor foil 17 may be Ag, Al, SUS, Ni, or Au, in addition to Cu, and may be an alloy of two or more different metals selected from among these metals. Though conductor foil 17 has a thickness of 18 µm in the present embodiment, conductor foil 17 may have a thickness approximately not smaller than 2 µm and not greater than 50 µm. Conductor foil 17 should only have a thickness which allows formation of a circuit.

An operation for forming a conductor pattern below may proceed after a plurality of resin sheets 12 with a conductor foil in a strip shape are prepared. In another method, a single large resin sheet 12 with a conductor foil, in which regions each in a strip shape are set and which should subsequently individually be cut into a plurality of resin sheets, may be prepared, an operation for forming a conductor pattern below may proceed with a large size being maintained, and the resin sheets each in a strip shape may subsequently be cut. Here, description is continued assuming that resin sheets 12 with a conductor foil each in a strip shape have already been cut.

Figure 5:
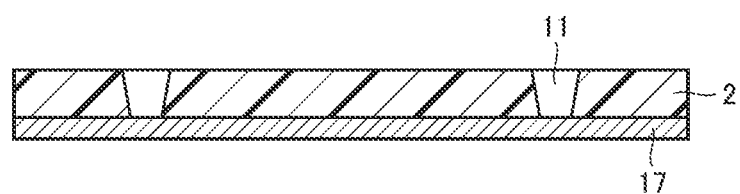
FIG. 5 is an illustrative diagram of a second step in the method of manufacturing a multi-layer resin substrate in the second embodiment based on the present disclosure.

Then, as shown in FIG. 5, a via hole 11 is formed to penetrate resin layer 2 by emitting carbon dioxide laser beams to a surface of resin sheet 12 with a conductor foil on the side of resin layer 2. Though via hole 11 penetrates resin layer 2, it does not penetrate conductor foil 17. Thereafter, as necessary, a smear (not shown) of via hole 11 is removed through treatment with a drug solution of permanganic acid or the like. Though the carbon dioxide laser beams are used for forming via hole 11, laser beams of other types may be employed. A method other than emission of laser beams may be adopted for forming via hole 11.

Figure 6:
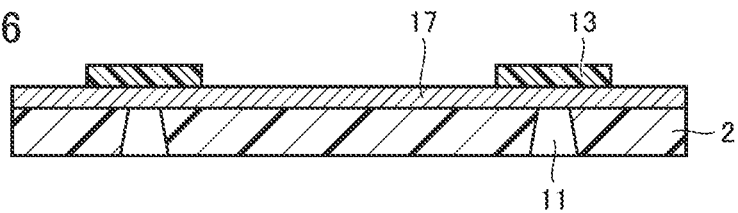
FIG. 6 is an illustrative diagram of a third step in the method of manufacturing a multi-layer resin substrate in the second embodiment based on the present disclosure.

Then, as shown in FIG. 6, a resist film is laminated on a surface of conductor foil 17 of resin sheet 12 with a conductor foil, and thereafter a resist pattern 13 is formed through exposure with the use of a photomask.

Figure 7:
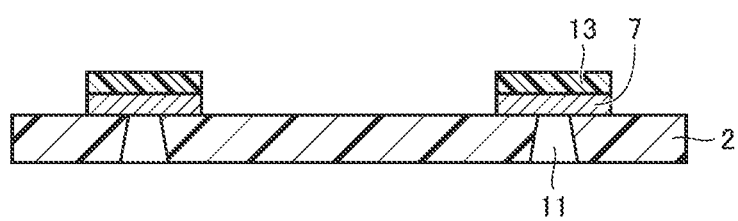
FIG. 7 is an illustrative diagram of a fourth step in the method of manufacturing a multi-layer resin substrate in the second embodiment based on the present disclosure.
Figure 8:
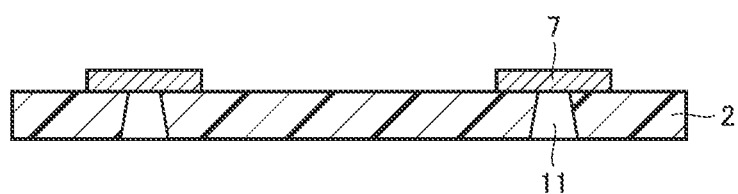
FIG. 8 is an illustrative diagram of a fifth step in the method of manufacturing a multi-layer resin substrate in the second embodiment based on the present disclosure.

Then, etching is carried out with resist pattern 13 serving as a mask, and as shown in FIG. 7, a portion of conductor foil 17 not covered with resist pattern 13 is removed. A portion of conductor foil 17 which remained after etching is referred to as "conductor pattern 7." Thereafter, as shown in FIG. 8, resist pattern 13 is removed. Desired conductor pattern 7 is thus obtained on one surface of resin layer 2.

Figure 9:
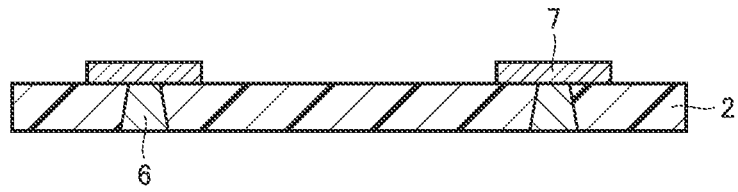
FIG. 9 is an illustrative diagram of a sixth step in the method of manufacturing a multi-layer resin substrate in the second embodiment based on the present disclosure.

Then, as shown in FIG. 9, via hole 11 is filled with a conductive paste with screen printing or the like. Screen printing is performed from a surface on a lower side in FIG. 8. Though via hole 11 is shown as facing downward for the sake of convenience of illustration in FIGS. 8 and 9, screen printing may be performed actually with a position being varied as appropriate. A conductive paste for filling may be composed mainly of copper or tin, or may be composed mainly, for example, of silver instead. This conductive paste may contain such an appropriate amount of metal powders as forming a layer of an alloy with a metal which is a material for conductor pattern 7 at a temperature for subsequent thermocompression bonding of stacked resin layers (hereinafter referred to as a "thermocompression bonding temperature"). Since this conductive paste contains copper, that is, Cu as a main component for exhibiting conductivity, this conductive paste may contain at least one of Ag, Cu, and Ni and at least one of Sn, Bi, and Zn, other than the main component. By thus filling the via hole with the conductive paste, via conductor 6 is formed.

Figure 10:
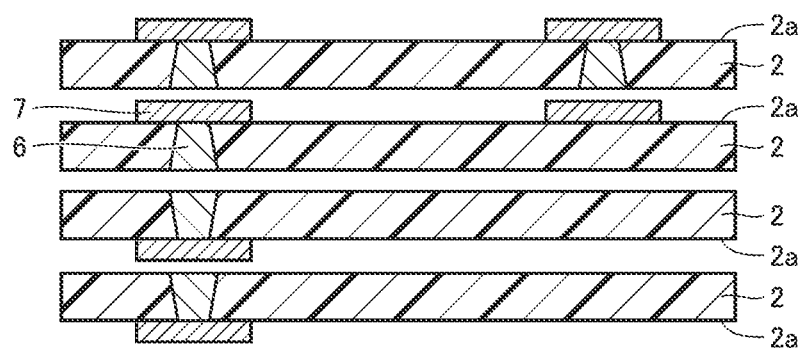
FIG. 10 is an illustrative diagram of a situation where a plurality of resin layers are prepared in the method of manufacturing a multi-layer resin substrate in the second embodiment based on the present disclosure.

Though treatment for one resin layer 2 has been illustratively described by way of example, via conductor 6 is formed as necessary by similarly carrying out treatment also for other resin layers 2 and forming as appropriate conductor pattern 7 in a desired region. The plurality of resin layers 2 are thus prepared as shown in FIG. 10. The procedure so far corresponds to the step S1. Though, via conductor 6 is formed after conductor pattern 7 is formed in the example described above, conductor pattern 7 may be formed after via conductor 6 is formed.

Then, in the step S2, at the surface of at least some resin layers 2 of the plurality of resin layers 2 shown in FIG. 10, a thermoplastic resin paint is applied to a region corresponding to a region insufficient in thickness as a stack as a whole during a process for stacking and thermocompression bonding the plurality of resin layers 2. Thus, as shown in FIG. 2, paint layer 8 is formed in a partial region of the surface of at least some resin layers 2 of the plurality of resin layers 2.

Figure 11:
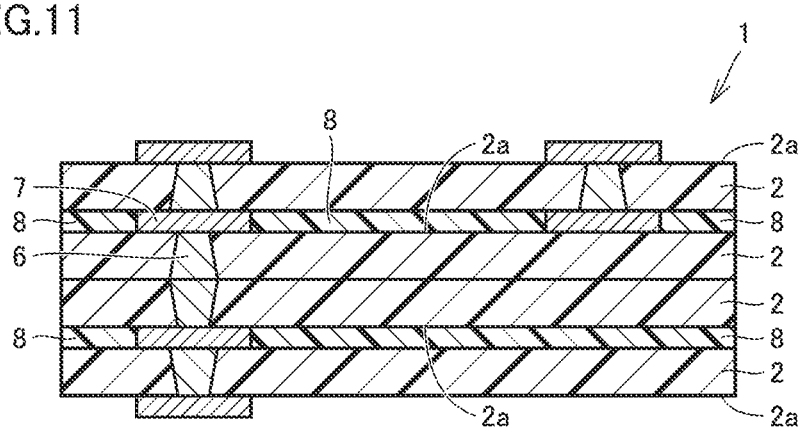
FIG. 11 is an illustrative diagram of a situation where a stack is formed by stacking the plurality of resin layers in the method of manufacturing a multi-layer resin substrate in the second embodiment based on the present disclosure.

Then, in the step S3, as shown in FIG. 11, the plurality of resin layers 2 are stacked. A stack 1 is formed by stacking the plurality of resin layers 2. Stack 1 has not yet been subjected to thermocompression bonding, and it is simply in a state of resin layers 2 as being layered. Since a region where paint layer 8 is arranged is in complementary relation with a region where conductor pattern 7 is present, paint layer 8 and conductor pattern 7 are located as being aligned in stack 1 as if they belonged to the same layer. Though via conductor 6 is formed in the step S1 in the example described above, the step of forming a via conductor may not be performed in the step S1 but via conductor 6 may be formed after paint layer 8 is formed in the step S3.

Figure 12:
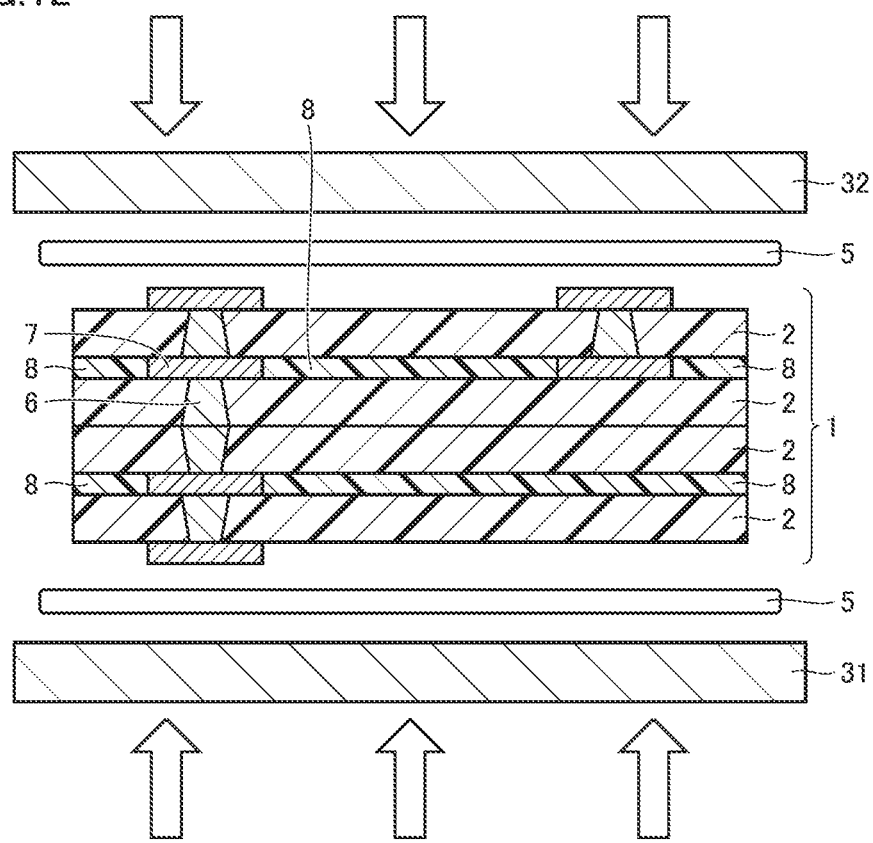
FIG. 12 is an illustrative diagram of a step of thermocompression bonding the stack in the method of manufacturing a multi-layer resin substrate in the second embodiment based on the present disclosure.
Figure 13:
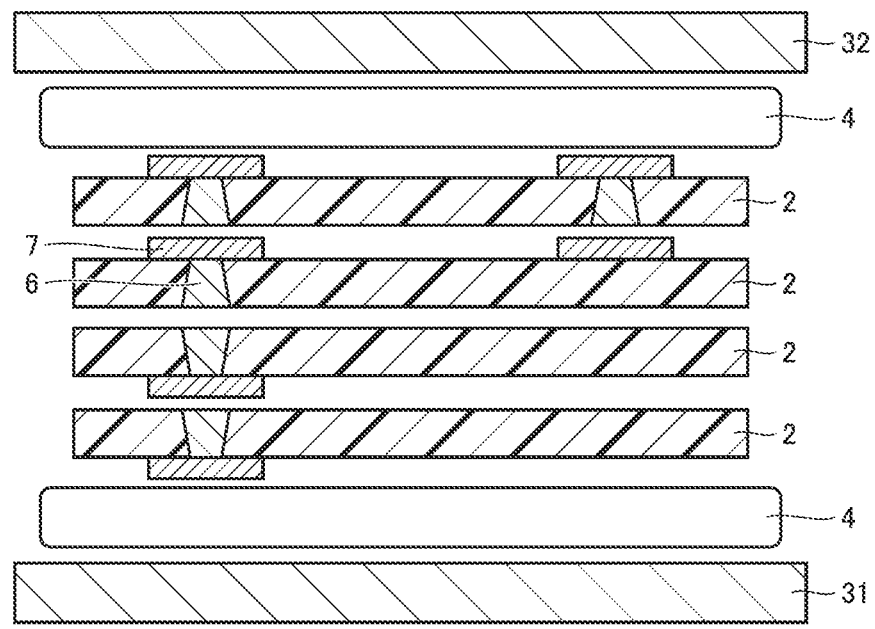
FIG. 13 is an illustrative diagram of one example of a method of manufacturing a multi-layer resin substrate based on a conventional technique.

In the step S4, as shown in FIG. 12, stack 1 is subjected to thermocompression bonding by applying a pressure and heat to stack 1 made of the plurality of resin layers 2 obtained in the step S3. In the example shown in FIG. 12, heating and pressurization is carried out in such a manner that a mold release material 5 is layered on each of upper and lower surfaces of stack 1 and pressing plates 31 and 32 further sandwich the layered structure from above and below. Thus, the plurality of resin layers 2 included in stack 1 are thermocompression bonded to each other, and consequently, multi-layer resin substrate 101 shown in FIG. 1 is obtained. During thermocompression bonding of resin layers 2 to each other, paint layer 8 interposed between resin layers 2 is also thermocompression bonded. Therefore, at a location where resin layer 2 and paint layer 8 are in direct contact with each other, the resin forming resin layer 2 itself and the resin forming paint layer 8 are bonded to each other as a result of thermocompression bonding. Thereafter, as necessary, a surface mount component is mounted.

Though it is optional to interpose mold release material 5 above and below stack 1 in the step S4, an operation for taking multi-layer resin substrate 101 obtained by thermocompression bonding from between pressing plates 31 and 32 can smoothly be performed by thus employing mold release material 5 in the step S4.

In the step S1, a cavity for accommodating an electronic component, that is, a space, may be formed by punching or the like, an electronic component may be placed in the cavity in the step S3, and then a plurality of resin layers 2 may be stacked. By doing so, an electronic component can be contained in the stack.

In the present embodiment, paint layer 8 is formed at the surface of at least some resin layers 2 of the plurality of resin layers 2 by applying the thermoplastic resin paint to the region corresponding to the region insufficient in thickness as stack 1 as a whole during a process for stacking and thermocompression bonding the plurality of resin layers 2, and the plurality of resin layers 2 for which such steps have been completed are stacked and subjected to thermocompression bonding. Thus, the thickness of paint layer 8 compensates for the thickness as the stack as a whole in the region where the thickness as stack 1 as a whole may have been insufficient. Therefore, even though individual resin layers 2 are different in thickness from each other depending on whether or not there is a local pattern, flatness of the outermost surface of the stack obtained by stacking these resin layers 2 can sufficiently be ensured.

In the method of manufacturing a multi-layer resin substrate based on the present embodiment, a thermoplastic resin as a main material for each resin layer 2 may be a liquid crystal polymer and the thermoplastic resin paint as a material for paint layer 8 may also be a paint of the liquid crystal polymer. By thus performing the manufacturing method, both of resin layer 2 and paint layer 8 as being stacked are layers of the liquid crystal polymer and characteristics of a material are equal therebetween. Therefore, electrical characteristics of an internal interconnection are less likely to be affected.

The thermoplastic resin paint may contain a powdery liquid crystal polymer. By thus performing the manufacturing method, a paint layer of the liquid crystal polymer can readily be formed to a desired thickness in a desired region.

The thermoplastic resin paint as a material for paint layer 8 may be obtained by dispersing the powdery liquid crystal polymer in a liquid. By thus performing the manufacturing method, a dispersion liquid of the liquid crystal polymer should only be applied in an application operation for forming a paint layer and operability is improved.

The powdery liquid crystal polymer here may have been subjected to surface treatment with plasma or ultra violet rays. By thus performing the manufacturing method, bonding strength of the powdery liquid crystal polymer is improved, strength of paint layer 8 itself increases, and strength of bonding between paint layer 8 and resin layer 2 also increases, as an effect of treatment with plasma or ultra violet rays.

The thermoplastic resin paint as a material for paint layer 8 may contain a liquid crystal polymer in a form of varnish. By thus performing the manufacturing method, a liquid crystal polymer in a form of varnish should only be applied in an application operation for forming a paint layer and operability is improved.

The step of obtaining the powdery liquid crystal polymer by pulverizing a biaxially oriented liquid crystal polymer film may be included before the step S2 of applying the thermoplastic resin paint. By thus pulverizing the liquid crystal polymer in a form of a film, pulverization can be achieved more readily than in a case of pulverization of a liquid crystal polymer, for example, in a form of pellets. In particular, by obtaining a powdery liquid crystal polymer with the use of a liquid crystal polymer in a form of a biaxially oriented film, unlike a case of use of a liquid crystal polymer in uniaxially oriented pellets or film, particles in a fibrous form can be avoided and a satisfactory powdery liquid crystal polymer can efficiently be obtained. Specifically, it is difficult also to prepare a paint from fibrous particles having a certain length and also difficult to obtain a paint for obtaining a stable coating film. In a case of pulverization of a liquid crystal polymer in a form of a biaxially oriented film, on the other hand, a powdery liquid crystal polymer of which particles are not fibrous but close to spherical can be obtained. By fabricating a paint with this powdery liquid crystal polymer, a paint as a thermoplastic resin paint to be employed in the present disclosure can readily be obtained in a stable manner. A known pulverization apparatus can be employed as appropriate for pulverizing a liquid crystal polymer in a form of a film.

A material for a biaxially oriented liquid crystal polymer film may be the same as the main material for resin layer 2. By employing as the liquid crystal polymer in the form of the biaxially oriented film, a material the same as the material for a liquid crystal polymer in a form of a film which mainly forms resin layer 2, resin layer 2 and paint layer 8 are composed of the same type of liquid crystal polymer, and hence stack 1 can be obtained without necessarily affecting characteristics of an internal interconnection.

In the step of obtaining the powdery liquid crystal polymer described above, the film of the liquid crystal polymer may be pulverized while it is frozen. By thus performing the manufacturing method, the film of the liquid crystal polymer can smoothly be pulverized and powders having a small particle size can efficiently be obtained. In order to pulverize the liquid crystal polymer while it is frozen, for example, while liquid nitrogen is poured over a film in a form of a tape which is composed of a liquid crystal polymer, the liquid crystal polymer film may successively be fed to a pulverization apparatus.

For example, the thermoplastic resin paint does not necessarily have to be applied to the entire "region corresponding to a region insufficient in thickness as a stack as a whole during a process for stacking and thermocompression bonding the plurality of resin layers." The thermoplastic resin paint may selectively be applied, for example, only to a portion of a region insufficient in thickness where a noticeable difference in thickness is produced.

In applying the thermoplastic resin paint, application to such a thickness as completely compensating for insufficiency in thickness is not necessarily required. So long as the thermoplastic resin paint is applied to a certain thickness, insufficiency in thickness can be compensated for to some extent and the effect of the present disclosure can be obtained.

In the method of manufacturing a multi-layer resin substrate based on the present disclosure, the "region insufficient in thickness as a stack as a whole" may be a region where pattern members or components to be contained in the stack of resin layers 2 are sparsely arranged.

The embodiments disclosed herein are illustrative and non-restrictive in every respect. The scope of the present disclosure is defined by the terms of the claims, rather than the description above, and is intended to include any modifications within the scope and meaning equivalent to the terms of the claims.

INDUSTRIAL APPLICABILITY

The present disclosure can be made use of for a multi-layer resin substrate and a method of manufacturing the same.

REFERENCE SIGNS LIST 1 stack; 2 resin layer; 2a main surface; 4 cushion material; 5 mold release material; 6 via conductor; 7 conductor pattern; 8 paint layer; 11 via hole; 12 resin sheet with conductor foil; 13 resist pattern; 17 conductor foil; 31, 32 pressing plate; 101 multi-layer resin substrate; and 901 multi-layer resin substrate (based on the conventional technique)

The invention claimed is:

1. A multi-layer resin substrate integrated by stacking and thermocompression bonding a plurality of resin layers each composed of a thermoplastic resin as a main material and having a main surface,
    said plurality of resin layers including a resin layer having a pattern member arranged on said main surface, and
    a surface of at least one resin layer of said plurality of resin layers having a paint layer, which is obtained by applying a thermoplastic resin paint to a region corresponding to a region insufficient in thickness as a stack as a whole during a process for stacking and thermocompression bonding said plurality of resin layers.

2. The multi-layer resin substrate according to claim 1, wherein
    said thermoplastic resin is a liquid crystal polymer and said thermoplastic resin paint comprises the liquid crystal polymer.

3. The multi-layer resin substrate according to claim 2, wherein
    said thermoplastic resin paint contains a powdery liquid crystal polymer.

4. The multi-layer resin substrate according to claim 3, wherein
    said thermoplastic resin paint is obtained by dispersing the powdery liquid crystal polymer in a liquid.

5. The multi-layer resin substrate according to claim 3, wherein
    said powdery liquid crystal polymer has been subjected to surface treatment with plasma or ultra violet rays.

6. The multi-layer resin substrate according to claim 2, wherein said thermoplastic resin paint contains a liquid crystal polymer in a form of varnish.

7. The multi-layer resin substrate according to claim 1, wherein
    said region insufficient in thickness as the stack as a whole is a region where said pattern members or components to be contained in the stack of said resin layers are sparsely arranged.

8. A method of manufacturing a multi-layer resin substrate, comprising the steps of:
    preparing a plurality of resin layers including a resin layer having a pattern member arranged on a main surface each composed of a thermoplastic resin as a main material and having the main surface;
    applying, at a surface of at least one resin layer of said plurality of resin layers, a thermoplastic resin paint to a region corresponding to a region insufficient in thickness as a stack as a whole during a process for stacking and thermocompression bonding said plurality of resin layers;

stacking said plurality of resin layers for which said step of applying a thermoplastic resin paint has been completed; and obtaining a stack including a paint layer composed of said thermoplastic resin paint by thermocompression bonding said stack of said plurality of resin layers obtained in said step of stacking by applying a pressure and heat to said stack.

9. The method of manufacturing a multi-layer resin substrate according to claim 8, wherein
said thermoplastic resin is a liquid crystal polymer and said thermoplastic resin paint comprises the liquid crystal polymer.

10. The method of manufacturing a multi-layer resin substrate according to claim 8, wherein
said thermoplastic resin paint contains a powdery liquid crystal polymer.

11. The method of manufacturing a multi-layer resin substrate according to claim 10, wherein
said thermoplastic resin paint is obtained by dispersing the powdery liquid crystal polymer in a liquid.

12. The method of manufacturing a multi-layer resin substrate according to claim 10, wherein
said powdery liquid crystal polymer has been subjected to surface treatment with plasma or ultra violet rays.

13. The method of manufacturing a multi-layer resin substrate according to claim 9, wherein
said thermoplastic resin paint contains a liquid crystal polymer in a form of varnish.

14. The method of manufacturing a multi-layer resin substrate according to claim 10, comprising the step of obtaining the powdery liquid crystal polymer by pulverizing a biaxially oriented liquid crystal polymer film before said step of applying the thermoplastic resin paint.

15. The method of manufacturing a multi-layer resin substrate according to claim 14, wherein
in said step of obtaining the powdery liquid crystal polymer, said liquid crystal polymer film is pulverized while it is frozen.

16. The method of manufacturing a multi-layer resin substrate according to claim 14, wherein
a material for said biaxially oriented liquid crystal polymer and the main material for said resin layer are common to each other.

17. The method of manufacturing a multi-layer resin substrate according to claim 8, wherein
said region insufficient in thickness as the stack as a whole is a region where said pattern members or components to be contained in the stack of said resin layers are sparsely arranged.

18. The multi-layer resin substrate according to claim 4, wherein
said powdery liquid crystal polymer has been subjected to surface treatment with plasma or ultra violet rays.

19. The method of manufacturing a multi-layer resin substrate according to claim 13, wherein
a solvent used for obtaining the liquid crystal polymer in the form of varnish is a solvent that does not dissolve the resin layers.

* * * * *